United States Patent [19]

Huber

[11] 3,781,868

[45] Dec. 25, 1973

[54] ANALOG-TO-DIGITAL CONVERTER

[75] Inventor: Charles J. Huber, Baltimore, Md.

[73] Assignee: Westinghouse Electric Corp., Pittsburgh, Pa.

[22] Filed: Sept. 29, 1971

[21] Appl. No.: 184,674

Related U.S. Application Data

[63] Continuation of Ser. No. 812,645, April 2, 1969, abandoned.

[52] U.S. Cl. .......... 340/347 P
[51] Int. Cl. .......... G08c 9/06
[58] Field of Search .......... 340/347 P, 166, 173 LM; 250/219 QA

[56] References Cited

UNITED STATES PATENTS

| | | | |
|---|---|---|---|
| 3,521,271 | 7/1970 | Rappaport | 340/347 P |
| 3,705,293 | 12/1972 | Cook | 235/61.7 B |
| 3,543,248 | 11/1970 | Oliver | 340/173 LM |
| 3,535,684 | 10/1970 | Raymond | 340/173 LM |
| 3,688,281 | 8/1972 | Verth | 340/173 LM |
| 3,651,498 | 3/1972 | Magill | 340/173 LM |

*Primary Examiner*—Maynard R. Wilbur
*Assistant Examiner*—Jeremiah Glassman
*Attorney*—F. H. Henson et al.

[57] ABSTRACT

Apparatus is disclosed for the conversion of an analog signal to its sampled digital form. The conversion is accomplished by deflecting a collimated beam of light with an electro-optic device driven by the analog signal. A plurality of light activated elements or phototransistors are positioned in the path of beam after it passes through the electro-optic device. The light activated elements are arranged in a predetermined pattern such that as the level of the analog signal varies and thus the deflection of the beam varies, different ones of the elements are correspondingly activated. Means including electrical circuit apparatus is connected to the elements for providing a digital output representative of the analog signal.

5 Claims, 9 Drawing Figures

INVENTOR.
CHARLES J. HUBER

BY Ernest P. Klipfel
ATTORNEY

ANALOG-TO-DIGITAL CONVERTER

CROSS-REFERENCE TO RELATED APPLICATIONS

This application is a continuation of Ser. No. 812 645, 4-02-69 now abandoned.

BACKGROUND OF THE INVENTION

This invention relates to analog-to-digital converters. Such converters are, of course, well known and are used in computer and the like applications where it is necessary to convert an analog signal, which varies as a function of some process or system variable, into digital form which can be fed into a digital computer. In certain applications such as radar installations and photographic data processing equipment, extremely fast conversion from analog-to-digital form is required. In order to meet the requirements of high conversion rates, optical apparatus utilizing the high speed properties of light have been developed for digitally encoding an analog signal. Such optical apparatus have used level sensitive light emitter arrays and photosensitive detector arrays to produce a digital output related to an analog signal level. This type apparatus provides high speed capability when compared to completely electronic apparatus, however, as with completely electronic apparatus many discrete components are required in the form of precision dividers to accurately determine the analog signal level.

SUMMARY OF THE INVENTION

In accordance with the invention, an analog-to-digital converter is provided comprising means, preferably a laser, for producing a collimated beam of light, together with at least one electro-optic device in the path of the beam of light for deflecting the beam as a function of the level of an applied analog signal. After passing through the electro-optic device, the deflected beam is directed onto light activated elements, preferably phototransistors. The light activated elements are arranged in a predetermined pattern such that as the level of the analog signal varies and thus the deflection of the beam of light varies, different ones of the light activated elements are correspondingly activated. Finally, means including electrical circuit apparatus is connected to the light activated elements for providing a digital output representative of the analog signal.

An object of the present invention is therefore, to provide an analog-to-digital converter of the type described in which the high speed properties of light, at least one electro-optic device and a plurality of light activated elements are utilized to digitize an analog signal.

Other objects, advantages and capabilities of the present invention will become apparent from the following detailed description taken in conjunction with the accompanying drawings which form a part of this specification.

DESCRIPTION OF THE PREFERRED EMBODIMENTS

Figure 1:
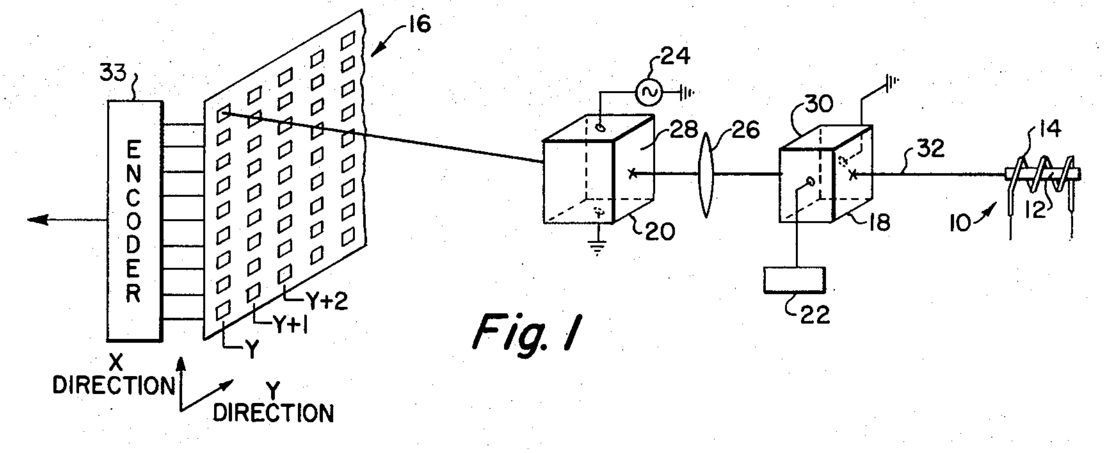
FIG. 1 is a schematic block diagram illustrating the principal components of an analog-to-digital converter according to the present invention.

In order to explain generally the principal components of the analog-to-digital converter according to the invention, reference is first made to FIG. 1. In FIG. 1, a source of collimated light is identified generally by the reference numeral 10. Preferably, the source of collimated light is a laser comprising a single rod 12 of paramagnetic material surrounded by a flashtube 14 in accordance with conventional practice. As is well known, a coherent beam of light of specific wavelength will be emitted from the rod 12, and as shown herein, this beam will be emitted through the left or transmitting end of the rod 12. A plurality of light activated elements, onto which the light beam from the laser is ultimately directed, is shown generally at 16. Preferably, the plurality of light activated elements comprises a mosaic of silicon phototransistors arranged in a predetermined pattern comprising an X–Y address system of vertical columns and horizontal rows as shown. Each phototransistor in the mosaic when illustrated, will generate a charge which can be read-out by the application of read-out signals to the mosaic. Such phototransistors are well known and are described in an article by Anders et al, entitled "Solid State Imaging System" published in the IEEE Transactions on Electron Devices, April 1968, Pages 191–196.

A pair of electro-optic devices 18 and 20 are disposed in the path of and between the source of collimated light 10 and the mosaic of phototransistors 16. Preferably, the electro-optic devices 18 and 20 are of the type in which a beam of light in passing therethrough will be deflected in accordance with an applied signal, the degree or amount of deflection being in proportion to the applied signal. Such electro-optic devices are well known and are described in an article by V. J. Fowler et al, entitled "A Survey Of Laser Beam Deflection Techniques," published in Applied Optics, October 1966, Volume 5, No. 10, Pages 1675–1682.

As utilized herein, the electro-optic device 18 has a source of positioning voltage 22, such as a staircase generator, applied thereto and the device 18 is oriented such that a beam of light from the laser 10 passing through it will be deflected horizontally in the direction of the arrow shown below the mosaic 16 identified Y-direction. The electro-optic device 20 has applied thereto an analog signal to be digitized which is originating from the source identified by the reference numeral 24. The orientation of the electro-optic device 20 is such that a beam of light passing through it will be deflected vertically in the direction of the arrow shown at the side of the mosaic 16 identified X-direction.

Positioned between the pair of electro-optic devices 18 and 20 is a culminating lens 26. The path of the beam of light as it emerges from the electro-optic device 18 is at an angle to the face 28 of the electro-optic device 20 and the purpose of the lens 26 is to deflect and redirect the beam such that the beam will strike the face 28 perpendicularly. If desired, this lens 26 may be shaped into the face 30 of the electro-optic device 18.

In general, the operation of the system just described is as follows, the laser beam, designated 32, is applied to the electro-optic device 18, which hereinafter will be alternately referred to as the Y-deflector, and the beam is deflected in the Y-direction in relation to the level of the positioning voltage 22. Thus the beam is now positioned to a particular column of the mosaic, as for example, the first or Y-column. The reason for first positioning the beam to a particular column will become more evident hereinafter. The laser beam 32 after passing through the lens 26 is now applied to the electro-optic device 20, which hereinafter will be alternately referred to as the X-deflector, and the beam is deflected in the X-direction in proportion to or as a function of the applied analog signal 24 such that it will strike a particular phototransistor in the Y-column. The beam is then stepped to the Y + 1 column, or to the second column of the mosaic 16 by the positioning voltage 22 and the process repeated, while the Y-column is sampled to determine the particular position or phototransistor which has been illuminated. Each position or phototransistor in the mosaic is connected to requisite logic or encoding circuitry, schematically illustrated by block 33, which provides a digital output or sequence representative of the level of the analog signal applied to the X-deflector 20. Thus, by reason of the fact that the phototransistors are discretely spaced on the mosaic 16 and since the particular element or phototransistor which is illuminated thereon is positioned thereon in a predetermined manner and related to the analog signal level through the angle of deflection as determined by the deflection coefficient of the X-deflector, the analog signal will be quantized by virtue of such discrete spacing of the mosaic phototransistors.

A single column mosaic or detector array could also be used with the elimination of the Y-deflector in the same manner, however, this would require that the laser beam be gated and that the sampling rate be reduced to allow for the time required to discharge or read-out the detector array before the application of the next laser pulse. Also, the rise time required for establishing the necessary field in the electro-optic device to enable it to deflect the laser beam, would have to taken into account. The advantage of a single column mosaic and only one electro-optic device is that the encoding or logic circuitry to which the phototransistors are connected could be reduced.

Figure 2:
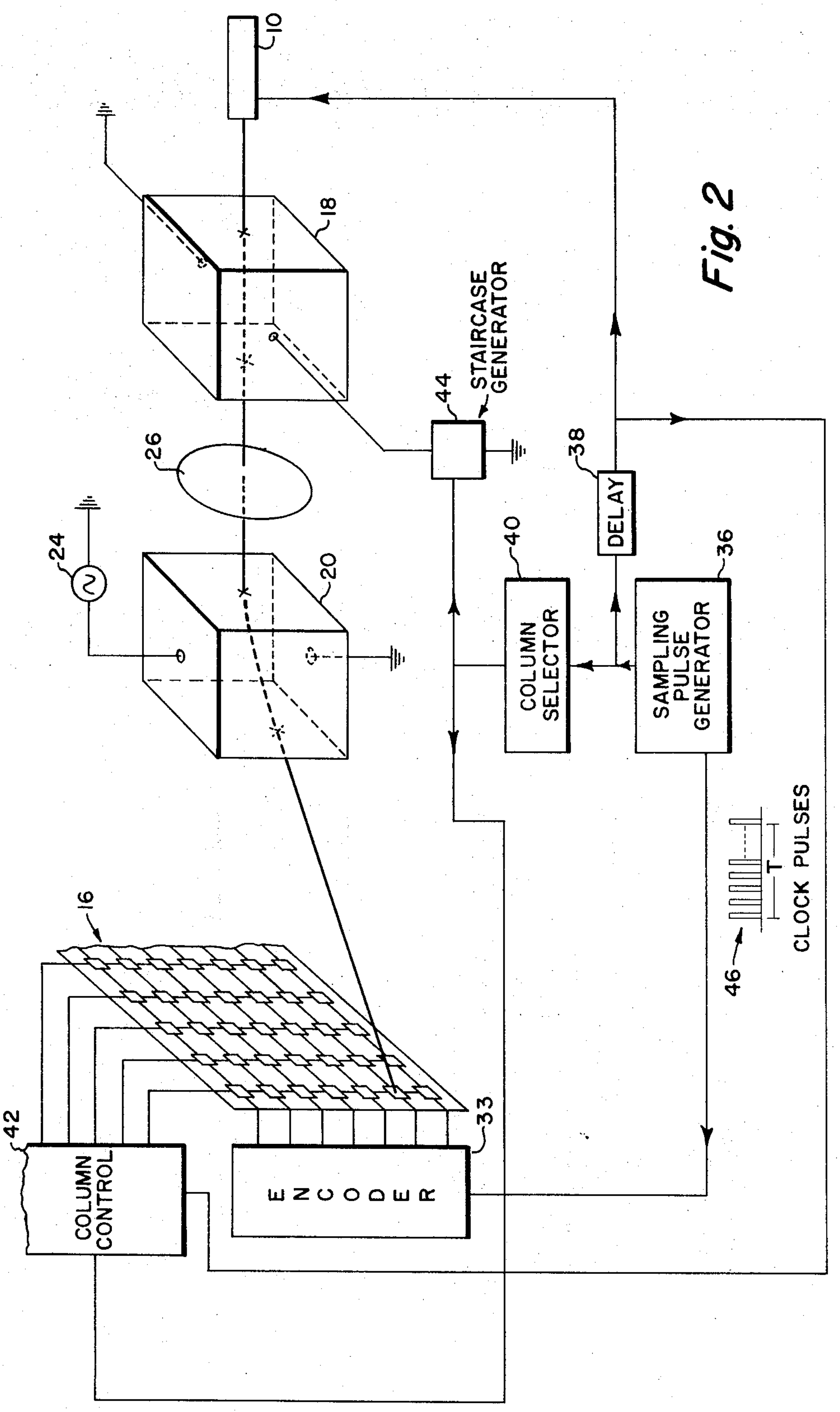
FIG. 2 is a schematic block diagram illustrating peripheral components for use with the principal components shown in FIG. 1.

Now, that the principal components of the system and the functions thereof have been explained, reference is made to FIG. 2 which is a schematic block diagram illustrating peripheral components for use with the principal components shown in FIG. 1.

Figure 3:
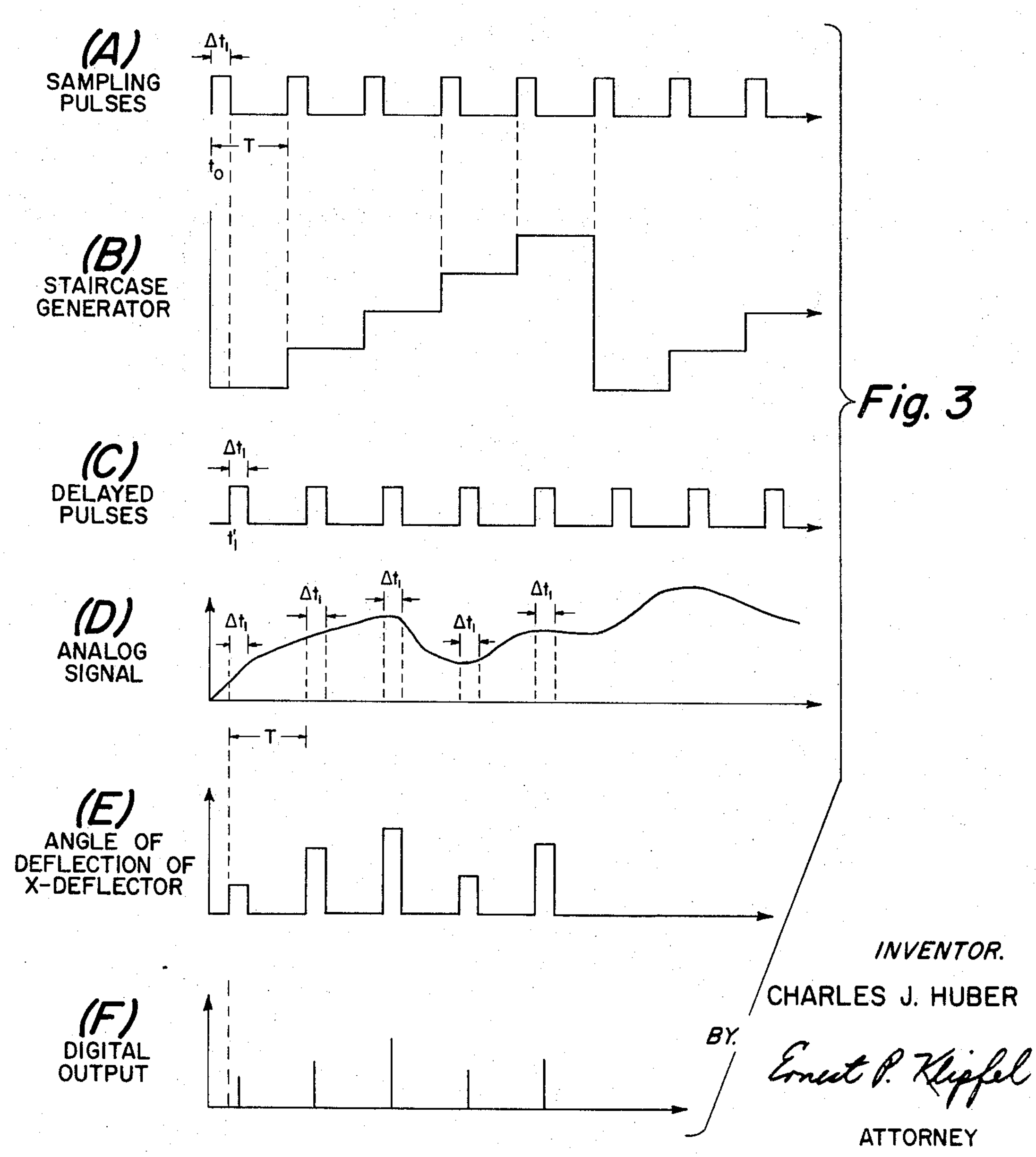
FIGS. 3A–3F comprise waveforms illustrating the operation of the circuit of FIG. 2

The system shown in FIG. 2 includes a sampling pulse-generator 36 which provides the basic clock for the system. As shown in FIG. 3A, the sampling pulse-generator 36 provides a pulse of width$\Delta t_1$ and period T. These pulses are applied to the source of coherent light 10 after passing through pulse-delay circuitry 38. In passing through the pulse-delay circuitry 38, the pulses from the pulse-generator 36 are delayed and the pulse width is shaped to provide a gate pulse for the coherent source 10. The delayed pulses are shown in FIG. 3C. The pulse-delay circuitry 38 provides a pulse width$\Delta t_1$ sufficiently wide to allow the coherent source 10 to produce a level sufficient to activate the phototransistors of the mosaic 16. The source 10 is gated on only during the sampling period $\Delta t_1$.

The pulses from the pulse-generator 36 are also applied to column-selector circuitry 40 which provides a control signal to column-control circuitry 42 and to staircase generator 44. The staircase-generator 44 provides the positioning voltage that is applied to the Y-deflector 18. The positioning voltage of the staircase-generator 44 during an interval T is such that the light beam from the coherent source 10 is deflected to the proper column of phototransistors in the mosaic 16. The column-control circuitry 42 selects the column of phototransistors in the mosaic 16 to be sampled in synchronism with the Y-deflector 18. Thus, the column-selector circuitry 40 provides a control signal to the column-control circuitry 42 and to staircase generator 44 so that the beam illuminates the same column that is sampled by the column-control circuitry 42.

The delayed pulses from the pulse-delay circuitry 38 are also applied to the column-selector circuitry 40 to activate column-sampling circuitry provided therein.

The period T of the pulse-generator 36 is determined by a combination of the amount of time required for the gated coherent source 10 to reach an acceptable level; the amount of time for the Y-deflector 18 to position the beam of light on the proper column and the logic speed of the digital circuits of the encoding circuitry 33. It may be noted here that the sampling pulse-generator 36 in addition to providing the sampling pulses also provides the higher speed clock pulses for the encoder 33 which are shown in FIG. 2 at 46.

Now that the functions of both the principal components and the peripheral components of the system shown in FIG. 2 have been explained, the system operation can best be explained by reference to FIGS. 3A–3F. FIG. 3A illustrates the pulses from the sampling pulse-generator 36; FIG. 3B illustrates the waveform of the staircase generator 44; FIG. 3C illustrates the delay-pulses from the pulse-delay circuitry 38; FIG. 3D illustrates a typical analog signal applied to the X-deflector 20; FIG. 3E illustrates graphically the angle of deflection of the beam in passing through the X-deflector 20 as increasing and decreasing as a function of the analog signal as the beam is stepped to various columns of the mosaic 16; and FIG. 3F illustrates graphically the digital output of the encoder 33 as being proportional to the level of the analog signal.

As stated above, the sampling pulse-generator provides the basic clock for the system. The clock signal is delayed in the pulse-delay circuitry 38 and its pulse width shaped to provide a gate pulse for the coherent source beam 32. The pulse of light from the coherent source 10 is deflected by the Y-deflector 18 in accordance with level of the positioning voltage as applied thereto by the staircase generator 44 so that it will eventually illuminate a particular column. This mechanism of stepping the beam across the mosaic 16 removes the mosaic discharge time or the time required to read-out the mosaic from slowing down the analog-to-digital conversion rate. The positioning voltage of the staircase generator 44 is applied before the coherent source 10 is gated on, thus allowing the proper field to be set up in the Y-deflector 18 so that when the beam of light strikes it, the beam will be deflected to the proper column.

The beam when it leaves the Y-deflector 18 is traveling at an angle to the X-deflector face 28, however, the culminating lens 26 deflects the beam into a direction perpendicular to the face 28.

As stated above, the X-deflector has the analog signal, shown in FIG. 3D, applied thereto and the beam is deflected at an angle which is proportional to the level of the signal. At time $t_1$, the sampling period$\Delta t_1$, begins. FIG. 3E illustrates the angle of deflection in relation to the level of the analog signal. Thus, the beam of light travels from the X-deflector 20 and strikes a particular phototransistor of the mosaic 16 in the selected column of the mosaic. As illustrated, the first or Y-column is utilized during the first sampling period $\Delta t_1$.

At this point in time the Y-deflector is stepped to the Y + 1 column and the column control circuitry 42 applies a command pulse to the column just illuminated. As stated previously, each of the phototransistors in each column are connected to the digital encoder 33. The encoder 33 senses the particular phototransistor illuminated in the Y-column and provides a corresponding unique binary sequence on its output line. This is graphically illustrated in FIG. 6F. Thus, the analog-to-digital conversion is complete. The process is repeated during each of the sampling periods $\Delta t_1$. The number of divisions into which the sampled wave or analog signal can be divided is determined by the deflecting characteristics of the X and Y deflectors and the number of phototransistors that can be placed in any one column. While only five vertical columns and a particular number of phototransistors in each column have been illustrated in the mosaic 16, any number of columns and phototransistors as may be required or desired may be utilized in the mosaic. The bandwidth of the sampled analog signal is limited by the response time of the X and Y-deflectors, the mosaic, and the digital circuitry of the encoder 33 as related by the sampling theory relationship:

Sampling frequency ≧ 2 times highest frequency component of the sampled wave.

As will be understood from the foregoing, the analog-to-digital conversion or quantizing of the analog signal is accomplished due to the fact that the phototransistors of the mosaic 16 are discretely spaced and the particular phototransistor which is illuminated in any one column is related to the analog signal level through the angle of deflection from the X-deflector 20.

Figure 4:
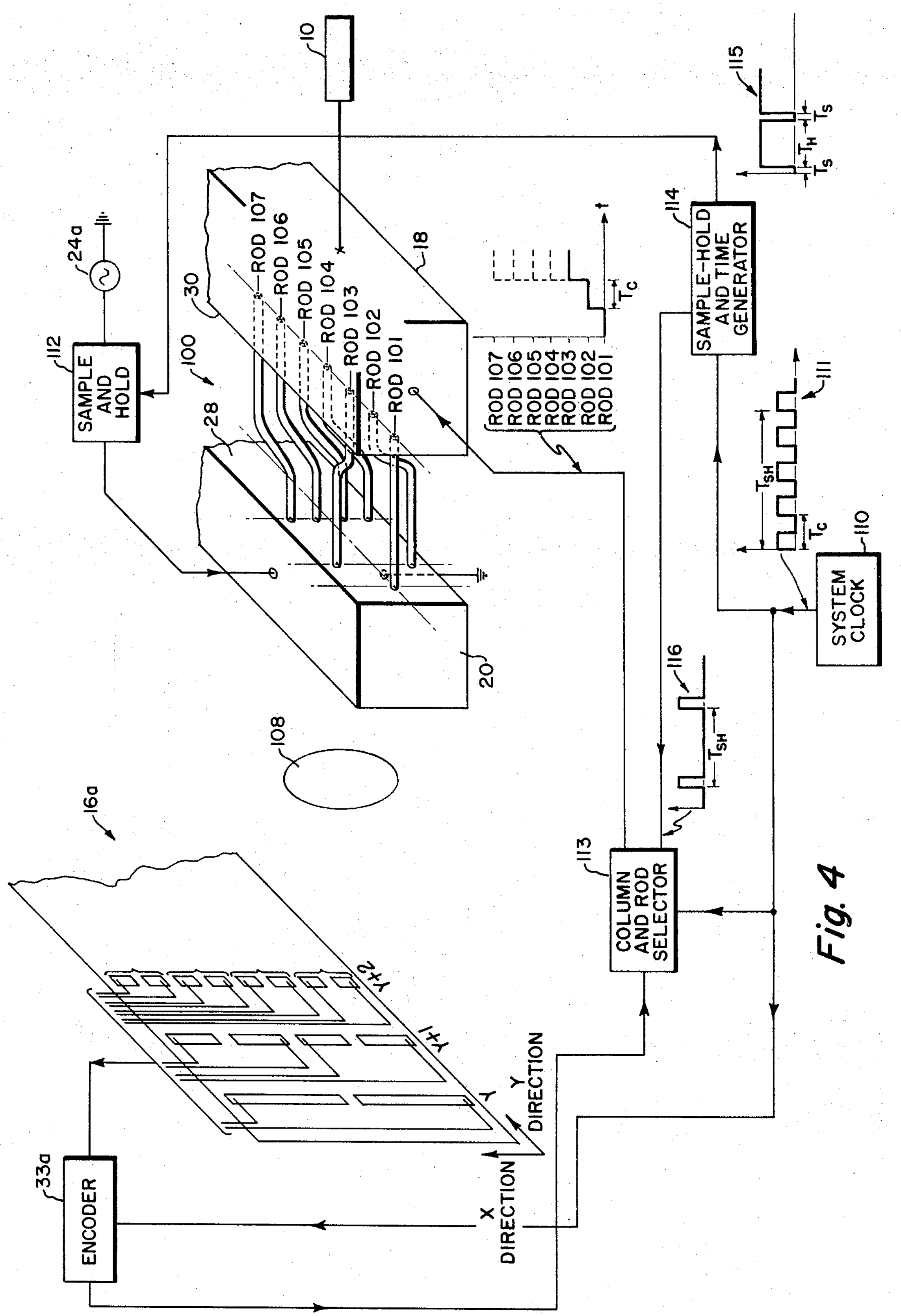
FIG. 4 is a schematic block diagram of a modified for of the invention illustrating both principal and peripheral components of the system.

The above described system is basically a parallel analog-to-digital converter. FIG. 4 illustrates a modification in the basic components of the system shown in FIGS. 1 and 2 whereby a serial analog-to-digital converter is provided. Basically, the system shown in FIG. 4 differs from that shown in FIG. 2 in that, a third optic device is provided between the X and Y deflectors and the arrangement of phototransistors on the mosaic 16*a* is changed.

Preferably, the third optic device comprises a plurality of fiber-optic devices 100, which originate on the face 30 of the Y-deflector 18 and terminate on the face 28 of the X-deflector 20. The devices 100 direct the beam as it emerges the Y-deflector to preselected locations on the face 28 of the X-deflector such that the beam enters the X-deflector at these locations. Each of the fiberoptic device 100 originate and are arranged along the horizontal centerline of the face 28, however, each terminates on the face 30 of the X-deflector 20 at different locations. The fiber-optic devices 101 terminates at the horizontal centerline of the face 30. The fiber-optic-devices 102 and 103 terminate below and above, respectively, the horizontal centerline of face 30. The fiber-optic devices 104 and 105 terminate below the horizontal centerline of face 30 and fiber-optic devices 106 and 107 terminate above the horizontal centerline of face 30. The fiber-optic device 100 will hereinafter be alternately referred to as rods.

The reasons for such an arrangement of the rods 100 will become apparent hereinafter. Also, for convenience of illustration, only seven fiber-optic devices 100 have been shown, however, as will become apparent hereinafter, the number of rods 100 can be increased.

The mosaic or array 16*a* differs from that shown in FIG. 1 in that each column no longer has an equal number of phototransistors therein but rather, the first or Y-column has two phototransistors which are ultimately the targets of rod 101; the second or Y + 1 column has four phototransistors with the lower two being the ultimate targets of rod 102 and the upper two being the ultimate targets of rod 103; and the third or Y + 3 column has eight phototransistors with the uppermost two being the ultimate target of rod 107, the two immediately below these being the ultimate target of rod 106, the next two down being the ultimate target of rod 105 and finally, the lowermost two being the ultimate target of rod 104. The reasons for such an arrangement will become apparent hereinafter, however, it may be noted that along the Y-direction as the number of rods 100 increases by $2^n$, the number of phototransistors in each column increases by $2^n$, where $n$ is an integer in both cases. An imaging lens 108 may be positioned between the X-deflector and the mosaic 16*a*, if required.

It may be explained here, that the basis for serial analog-to-digital conversion is to make sequential approximations to the analog signal level. Generally, the analog signal is sampled for a period $T_S$ and held for a period $T_H$ during which time the sequential operations are carried out.

The operation of the serial analog-to-digital converter shown in FIG. 4 will be explained in conjunction with a description of the peripheral components of the system. The system shown in FIG. 4 includes a system clock 110 which generates the timing pulses for the system. As shown in FIG. 4 at 111, the system clock provides pulses of period $T_C$. The time identified as $T_{SH}$ is the sample and hold time of system and is merely a multiple of the period $T_C$.

The pulses from the system clock 110 are applied to sample and hold circuitry 112 and to column and rod selector circuitry 113 after passing through a sample-hold and time generator 114. In passing through the generator 114, the pulses are shaped to provide the waveforms as indicated at 115 and 116. The time identified as $T_S$ is the time required for the sample and hold circuitry 112 to sample the analog signal, and the time $T_H$ is the time the sample and hold circuitry 112 must hold the sampled signal. Unconditioned pulses from the system clock 110 are also applied to the encoder 33*a* and to the column and rod selector circuitry 113. The column and rod selector circuitry 113 comprises logic circuitry and a staircase generator which applies a voltage to the Y-deflector 18 and positions or determines which of the rods 100 the beam of light from the source 10a should pass through.

In operation, the analog signal 24*a* is sampled and held by the sample and hold circuit 112. The sample and hold circuit 112 applies the "held" signal to the X-deflector 20. The sample and hold circuitry 112, as described above, is activated by the sample-hold and time generator 114 which provides the timing signals for sampling and holding the analog signal. The generator 114 is time synchronous with the system clock 110.

At the beginning of the time sequence, a start signal is sent to the column and rod selector circuit 113 which then provides a signal to the Y-deflector to position the beam to rod 101. The beam then passes through rod 101 to the X-deflector where it is deflected by the hold signal from the sample and hold circuit 112. The beam will be deflected in the X-direction. The scale factor of the deflection is such that the range, as defined by the maximum and minimum expected levels of the analog signal, will cause the beam to be deflected and illuminate the upper and lower halves of the rod 101 targets, respectively. If the level of the analog signal is greater than one-half the range, the beam will strike the upper half of the rod 101 target, if less than one-half the range, the lower half of the rod 101 target will be illuminated.

The encoder 33*a* puts out a "1" for an upper half strike and a "0" for a lower half strike of the rod 101 target. The choice of "1" and "0" is arbitrary except in the sense of normally processed digital information. At the same time the "0" or "1" is sent by the encoder 33*a* to the column and rod selector circuit 113 where this information is combined with the fact that the second period of approximation has arrived as determined by the system clock and the time lapse from the reception of $T_{SH}$ from the sample and hold time generator 114. The combined information then produces a voltage from the staircase generator contained in the column and rod selector 113 so that the beam is positioned to rod 102 or rod 103.

The selection of rod 102 or rod 103 is determined by the following: An upper half rod 101 target strike means that the level of the analog signal is greater than one-half the expected range, hence the signal can be placed on the bottom of the X-deflector, i.e., below the horizontal centerline thereof, and be expected to strike somewhere between the bottom and one-half the X-direction of the mosaic 16*a*. This is because the scale factor of the X-deflector does not change. Now rod 102 is displaced from rod 101 in the Y-direction so that the second or Y + 1 column of the mosaic 16*a* is the target. The target of rod 102 in the Y + 1 column is split into two sections, thereby allowing a decision as to whether the signal level is in the three-quarters to maximum level or in the one-half to three-quarters level range. The arrangement has the effect of providing an effective gain of two (2) to the "hold" signal. Thus, an upper half rod 101 strike will produce a signal from the column and rod selector circuit 113 such that the beam is applied to rod 102. A lower half rod 101 target strike, however, means the signal is less than one-half the expected analog signal level. By the reasoning applied above with reference to an upper half rod 101 target strike, the beam applied to the upper edge of the mosaic 16*a* will strike the mosaic between the upper edge and one-half the X-direction length. Thus, a lower half rod 101 target strike will produce a signal from the column and rod selector circuit 113 such that the beam is applied to rod 103. The target of rod 103 in the Y + 1 column is also split into two sections, thereby allowing a decision as to whether the analog signal level is in the one-quarter to one-half level range or in the minimum to one-quarter level range.

Assuming now that rod 102 has been selected, the beam in passing through the X-deflector will strike either of its targets in the Y + 1 column depending on the analog signal level. If the level of the analog signal is of such a value that it will deflect the beam somewhere between one-quarter and one-half the X-direction length of the mosaic 16*a*, the beam will of course strike the upper of the rod 102 targets. This will result in the encoder putting out a "1" and effecting movement of the beam to rod 104 in the Y + 3 column by the process as above described with reference to the beam being stepped from rod 101 to 102 or 103. If, however, the level of the analog signal is of such a value that it will deflect the beam somewhere between the bottom edge and one-quarter the X-direction length of the mosaic 16*a*, the beam will strike the lower of the rod 102 targets. This will result in the encoder 33*a* putting out a "0" and effecting movement of the beam to rod 105 by the process as above described with reference to the beam being stepped from rod 101 to 102 or 103.

Using similar reasoning the following is true: If the lower half of the rod 103 target is illuminated, the beam will be next positioned to rod 106, and if the upper half of the rod 103 target is illuminated, the beam will be next positioned to rod 107. The process will continue with the maximum number of approximations to the analog signal level being determined by the achievable number of rods which can be physically incorporated between the X and Y-deflectors and the achievable number of corresponding phototransistors which can be physically incorporatd on the mosaic. Each sequence of "1" and "0" put out by the encoder thus represents the level of the analog signal during a sampling period.

While the fiber-optic devices 100 have been shown between the X and Y deflectors for positioning the beam to a given column on the mosaic 16*a*, this positioning could be accomplished with a third electro-optic device and culminating lens positioned between each of the electro-optic devices and between the X-deflector and the mosaic.

As in the case of the parallel analog-to-digital converter first described, the analog signal is converted to its sampled digital form in the serial analog-to-digital converter by deflecting a collimated beam of light with an electro-optic device driven by the analog signal onto a mosaic of phototransistors, which phototransistors are arranged in a predetermined pattern such that as the level of the analog signal varies and thus the deflection of the beam varies, different ones of the phototransistors are correspondingly activated. In both embodiments of the invention an encoder is connected to the phototransistors for providing a digital output representative of the analog signal.

I claim as my invention:

1. An analog-to-digital converter comprising:

a. means for producing a collimated beam of light, b. a first electro-optic device in the path of said beam of coherent light for deflecting said beam in a first predetermined direction as a function of the level of an analog signal, c. a second electro-optic device in the path of said coherent light for deflecting said beam in a direction orthogonal to the deflection of the beam by said first electro-optical device, d. a plurality of light activated sensing elements positioned in an M-N type matrix where M represents columns and N represents rows, said matrix being disposed generally at right angles to said light beam to be scanned thereby after it passes through said electro-optical devices, e. all of said elements in any one row being designed to generate signals of the same type in response to said collimated beam of light, f. all of said elements in different rows producing an output signal which is different from that produced by the elements in the next adjacent rows, g. all of said elements being capable of retaining their excited state until read out by the application of read-out signals to said mosaic, h. means including electrical circuit apparatus connected to said light activated elements for providing a digital output representative of sampled points of said analog signal.

2. The combination as set forth in claim 1 wherein the deflections of said second electro-optical device are synchronized with the reflections of said first electro-optical device to scan said columns to produce output signals from elements in said columns in immediate sequence.

3. The combination as set forth in claim 1 wherein said second electro-optical device directs the light beam at successive intervals from one column to the next adjacent column so that the elements of the next adjacent column can be activated before the last element in an adjacent column has completed its response to the light beam.

4. The combination as set forth in claim 1, including means disposed between said first and second electro-optical devices for directing said beam as it emerges from said first electro-optical device to preselected locations on said second electro-optical device at said preselected locations.

5. The combination as set forth in claim 1 wherein said means disposed between said first and second electro-optical devices comprises a plurality of fiber optic devices.

* * * * *